United States Patent
Bang

(10) Patent No.: US 12,140,627 B2
(45) Date of Patent: Nov. 12, 2024

(54) APPARATUS AND METHOD FOR AVOIDING COLLISION BETWEEN DATA

(71) Applicant: HYUNDAI MOBIS CO., LTD., Seoul (KR)

(72) Inventor: Sung Hoon Bang, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 3 days.

(21) Appl. No.: 18/202,809

(22) Filed: May 26, 2023

(65) Prior Publication Data

US 2024/0264228 A1 Aug. 8, 2024

(30) Foreign Application Priority Data

Feb. 3, 2023 (KR) .................. 10-2023-0014924

(51) Int. Cl.
*G01R 31/317* (2006.01)
*H04L 1/00* (2006.01)
*H04L 1/08* (2006.01)
*H04W 74/0833* (2024.01)
*B60L 58/12* (2019.01)
*B60L 58/22* (2019.01)
*H02J 7/00* (2006.01)

(52) U.S. Cl.
CPC ...... *G01R 31/31713* (2013.01); *H04L 1/0061* (2013.01); *H04L 1/08* (2013.01); *H04W 74/0841* (2013.01); *B60L 58/12* (2019.02); *B60L 58/22* (2019.02); *H02J 7/00032* (2020.01)

(58) Field of Classification Search
CPC ... G01R 31/31713; H04L 1/08; H04L 1/0061; H04W 74/0841
See application file for complete search history.

(56) References Cited

U.S. PATENT DOCUMENTS

| | | | |
|---|---|---|---|
| 7,693,174 B2 * | 4/2010 | Ishibashi | H04W 74/0825 370/445 |
| 2014/0269758 A1 * | 9/2014 | Sutterlin | H04W 74/0841 370/445 |
| 2018/0070363 A1 * | 3/2018 | Chakraborty | H04B 17/318 |

FOREIGN PATENT DOCUMENTS

KR 10-0198416 B1 6/1999

* cited by examiner

*Primary Examiner* — Shelly A Chase
(74) *Attorney, Agent, or Firm* — Morgan, Lewis & Bockius LLP

(57) ABSTRACT

An apparatus for avoiding a collision between data. The apparatus includes a plurality of integrated circuits (ICs) configured to mutually perform insulation communication, an amplitude detection module configured to detect amplitudes of transmission data and reception data that are input and output through pins of the IC during the insulation communication between the plurality of ICs, and a signal pattern error detection module configured to determine a collision situation between the transmission data and the reception data by comparing an amplitude of transmission data, which is generated by a processor in a TX mode of the IC, and the amplitude of the transmission data, which is detected through the pins of the IC by the amplitude detection module.

10 Claims, 6 Drawing Sheets

APPARATUS AND METHOD FOR AVOIDING COLLISION BETWEEN DATA

CROSS-REFERENCE TO RELATED APPLICATION

This application claims priority from and the benefit of Korean Patent Application No. 10-2023-0014924, filed on Feb. 3, 2023, which is hereby incorporated by reference for all purposes as if set forth herein.

BACKGROUND

Field

Exemplary embodiments of the present disclosure relate to an apparatus and method for avoiding a collision between data, and more particularly, to an apparatus and method for avoiding a collision between data, which can detect and avoid a collision between transmission data and reception data upon insulation communication between integrated circuits (ICs).

Discussion of the Background

In general, a battery for a vehicle essentially includes a battery management system (BMS) because the battery requires cell balancing.

The BMS includes a communication function in order to know information of a battery cell (or a stack cell), such as a voltage, a charging/discharging capacity, and a current, in a cell balancing process.

Furthermore, the BMS performs insulation communication using insulating elements (e.g., a transformer TF and a capacitor C) due to a voltage difference between battery modules.

For example, as illustrated in FIG. 1, in general, a fuel cell system includes a plurality of integrated circuits (ICs) IC #1 to IC #N for sensing a battery voltage, insulating elements TF and C for connecting the plurality of ICs IC #1 to IC #N, and a micom (i.e., a microcomputer) 110 for performing control through communication with the plurality of ICs IC #1 to IC #N.

In this case, it is important for the fuel cell system to accurately sense a voltage of a battery for a vehicle and also to transfer a command and battery information (e.g., a voltage, a charging/discharging capacity, and a current of a battery cell) through the micom 110.

However, in order to prevent damage by a fire to the battery, insulation is required for each of the ICs IC #1 to IC #N because different voltages are required for the transmission and reception of the battery information in view of the characteristics of the battery. Furthermore, each of the ICs IC #1 to IC #N prevents damage by a fire, which is attributable to different voltages and noise, by performing the insulation by using the transformer TF or the capacitor C.

However, a collision may occur between transmission data and reception data in a process of exchanging the data because each of the ICs IC #1 to IC #N performs communication asynchronously.

In particular, in a system structure in which an interrupt, such as battery thermal runaway, may occur through diagnosis, there is a problem in that, in a situation in which signals (or transmission data and reception data) between two ICs collide against each other, skipping of a signal or to wait for the re-reception of a signal may cause a dangerous result.

Accordingly, there is a need for a method capable of transferring signals (or transmission data and reception data) normally by detecting and avoiding a collision between the transmission data and the reception data when the signals (or transmission data and reception data) between two ICs collide against each other (e.g., when a critical fault alarm (CFA) occurs).

The Background technology of the present disclosure is disclosed in Korean Patent No. 10-0198416 (registered on Mar. 2, 1999).

SUMMARY

Various embodiments are directed to an apparatus and method for avoiding a collision between data, which can detect and avoid a collision between transmission data and reception data upon insulation communication between integrated circuits (ICs).

In an embodiment, an apparatus for avoiding a collision between data includes a plurality of integrated circuits (ICs) configured to mutually perform insulation communication, the plurality of integrated circuits including a first integrated circuit, an amplitude detection module configured to detect amplitudes of transmission data and reception data that are input and output through pins of the first integrated circuit during the insulation communication between the plurality of integrated circuits, and a signal pattern error detection module configured to determine a collision situation between the transmission data and the reception data by comparing a first amplitude of transmission data, which is generated by a processor in a transmission mode of the first integrated circuit, and a second amplitude of the transmission data, which is detected through the pins of the first integrated circuit by the amplitude detection module, wherein the processor performs an avoidance operation when determining a collision situation between the transmission data and the reception data.

In the present disclosure, the signal pattern error detection module detects a situation in which the reception data is input through the pins simultaneously when the transmission data is output through the pins in the transmission mode of the first integrated circuit, as a situation in which the transmission data and the reception data collide against each other.

In the present disclosure, the amplitude detection module detects a waveform of a pattern including a waveform different from a waveform of the transmission data generated by the processor due to energy charging of the transmission data and the reception data in the pins, when there occurs a situation in which the transmission data and the reception data collide against each other through the pins in the transmission mode of the first integrated circuit.

In the present disclosure, the amplitude detection module detects a waveform having an amplitude greater than a second threshold Vth2 that has been set to determine an amplitude of normal transmission data, when a pulse of the transmission data and a pulse of the reception data overlap in the situation in which the transmission data and the reception data collide against each other through the pins in the transmission mode of the first integrated circuit.

In the present disclosure, when the transmission data and the reception data collide against each other through the pins in the transmission mode of the first integrated circuit, the processor starts count-up and then retransmits the transmission data when a count value reaches a preset count value.

In the present disclosure, the count value is set by multiplying an ID that is differently set for each of the integrated circuits by a pre-designated interval value.

In an embodiment, a method of avoiding a collision between data includes detecting, by an amplitude detection module, amplitudes of transmission data and reception data that are input and output through pins of a first integrated circuit (IC) among a plurality of integrated circuits during insulation communication between the plurality of integrated circuits mutually performing insulation communication, comparing, by a signal pattern error detection module, a first amplitude of transmission data, which is generated by a processor in a transmission mode of the first integrated circuit, and a second amplitude of the transmission data that is detected through the pins of the first integrated circuit by the amplitude detection module, and performing, by the processor, an avoidance operation in response to a collision situation between the transmission data and the reception data.

In the present disclosure, the method may further include determining, by the signal pattern error detection module, the collision situation between the transmission data and the reception data, the determination including detecting, by the signal pattern error detection module, a situation in which the reception data is input through the pins of the first integrated circuit simultaneously while the transmission data is output through the pins in the transmission mode of the first integrated circuit, as a situation in which the transmission data and the reception data collide against each other.

In the present disclosure, in order to detect a situation in which the transmission data and the reception data collide against each other through the pins in the transmission mode of the first integrated circuit, the method may further include detecting, by the amplitude detection module, a waveform of a pattern including a waveform different from a waveform of the transmission data generated by the processor due to energy charging of the transmission data and the reception data in the pins of the first integrated circuit.

In the present disclosure, the transmission data and the reception data collide against each other through the pins in the transmission mode of the first integrated circuit, the method includes starting, by the processor, count-up and then retransmitting, by the processor, the transmission data in response to a count value reaching a preset count value.

According to the present disclosure, a collision between transmission data and reception data upon insulation communication between ICs can be detected and avoided.

Furthermore, according to the present disclosure, transmission data and reception data can be transferred normally by avoiding a collision between the transmission data and the reception data upon insulation communication between ICs.

DETAILED DESCRIPTION OF THE ILLUSTRATED EMBODIMENTS

Figure 1:
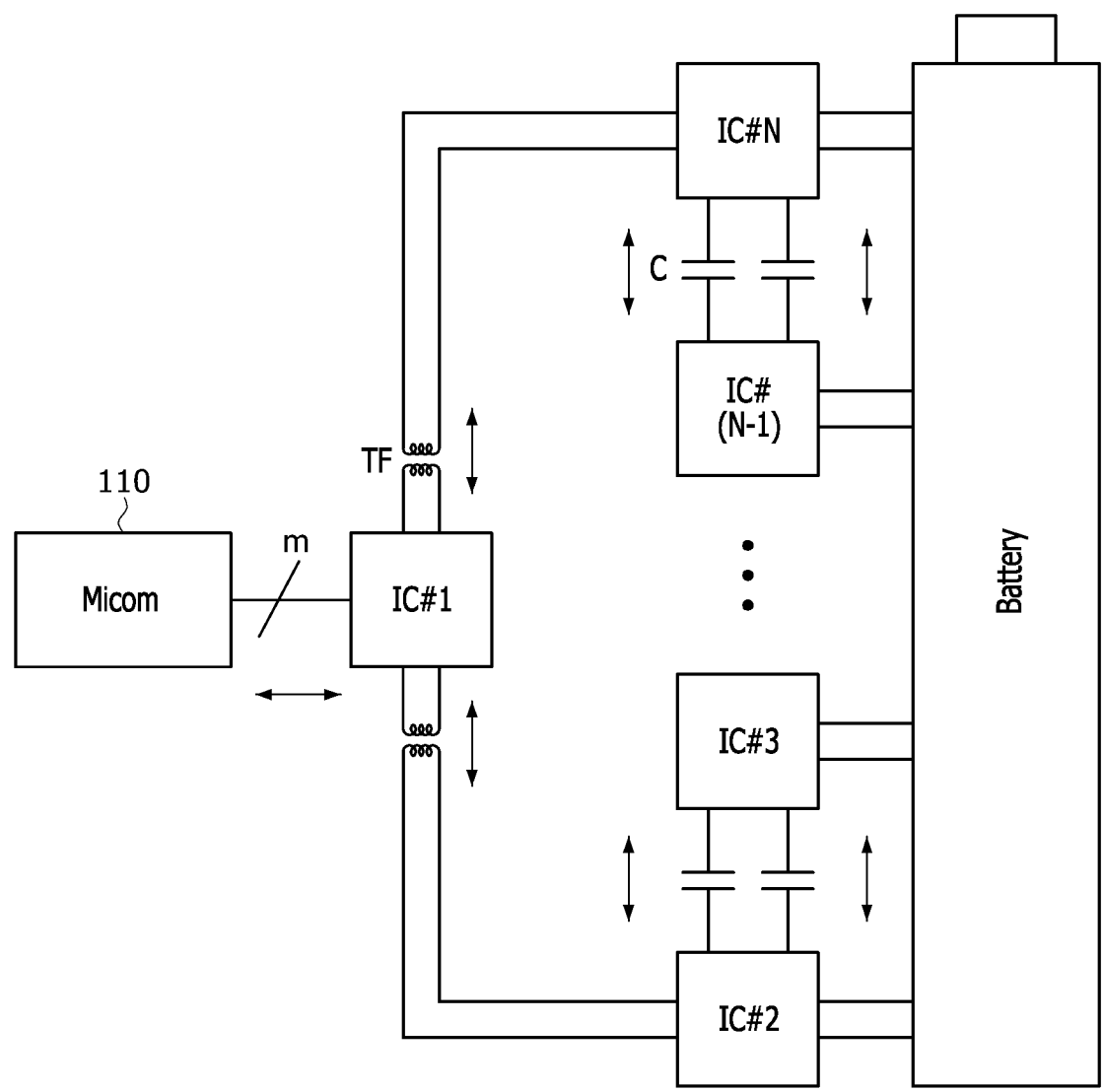
FIG. 1 is an exemplary diagram illustrating a schematic construction of a fuel cell system performing insulation communication, which is related to an embodiment of the present disclosure.

The components described in the example embodiments may be implemented by hardware components including, for example, at least one digital signal processor (DSP), a processor, a controller, an application-specific integrated circuit (ASIC), a programmable logic element, such as an FPGA, other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be embodied as a program that is executable by a computer, and may be implemented as various recording media such as a magnetic storage medium, an optical reading medium, and a digital storage medium.

Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing by, or to control an operation of a data processing apparatus, e.g., a programmable processor, a computer, or multiple computers. A computer program(s) may be written in any form of a programming language, including compiled or interpreted languages and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network.

Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic, magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc. and magneto-optical media such as a floptical disk, and a read only memory (ROM), a random access memory (RAM), a flash memory, an erasable programmable ROM (EPROM), and an electrically erasable programmable ROM (EEPROM) and any other known computer readable medium. A processor and a memory may be supplemented by, or integrated into, a special purpose logic circuit.

The processor may run an operating system (OS) and one or more software applications that run on the OS. The processor device also may access, store, manipulate, process, and create data in response to execution of the software. For purpose of simplicity, the description of a processor device is used as singular; however, one skilled in the art will be appreciated that a processor device may include multiple processing elements and/or multiple types of processing elements. For example, a processor device may include multiple processors or a processor and a controller. In addition, different processing configurations are possible, such as parallel processors.

Also, non-transitory computer-readable media may be any available media that may be accessed by a computer, and may include both computer storage media and transmission media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

Hereinafter, with reference to the accompanying drawings, embodiments of the present disclosure will be described in detail so that a person skilled in the art can readily carry out the present disclosure. However, the present disclosure may be embodied in many different forms and is not limited to the embodiments described herein.

In the following description of the embodiments of the present disclosure, a detailed description of known functions and configurations incorporated herein will be omitted when it may make the subject matter of the present disclosure rather unclear. Parts not related to the description of the present disclosure in the drawings are omitted, and like parts are denoted by similar reference numerals.

In the present disclosure, components that are distinguished from each other are intended to clearly illustrate each feature. However, it does not necessarily mean that the components are separate. That is, a plurality of components may be integrated into one hardware or software unit, or a single component may be distributed into a plurality of hardware or software units. Thus, unless otherwise noted, such integrated or distributed embodiments are also included within the scope of the present disclosure.

In the present disclosure, components described in the various embodiments are not necessarily essential components, and some may be optional components. Accordingly, embodiments consisting of a subset of the components described in one embodiment are also included within the scope of the present disclosure. In addition, embodiments that include other components in addition to the components described in the various embodiments are also included in the scope of the present disclosure.

In the present disclosure, when a component is referred to as being "linked," "coupled," or "connected" to another component, it is understood that not only a direct connection relationship but also an indirect connection relationship through an intermediate component may also be included. In addition, when a component is referred to as "comprising" or "having" another component, it may mean further inclusion of another component not the exclusion thereof, unless explicitly described to the contrary.

In the present disclosure, the terms first, second, etc. are used only for the purpose of distinguishing one component from another, and do not limit the order or importance of components, etc., unless specifically stated otherwise. Thus, within the scope of this disclosure, a first component in one exemplary embodiment may be referred to as a second component in another embodiment, and similarly a second component in one exemplary embodiment may be referred to as a first component.

Hereinafter, embodiments of the present disclosure will be described with reference to the accompanying drawings.

Hereinafter, an apparatus and method for avoiding a collision between data will be described below with reference to the accompanying drawings through various exemplary embodiments.

In this process, the thicknesses of lines or the sizes of elements illustrated in the drawings may have been exaggerated for the clarity of a description and for convenience' sake. Terms to be described below have been defined by taking into consideration their functions in the present disclosure, and may be changed depending on a user or operator's intention or practice. Accordingly, such terms should be defined based on the overall contents of this specification.

Figure 2:
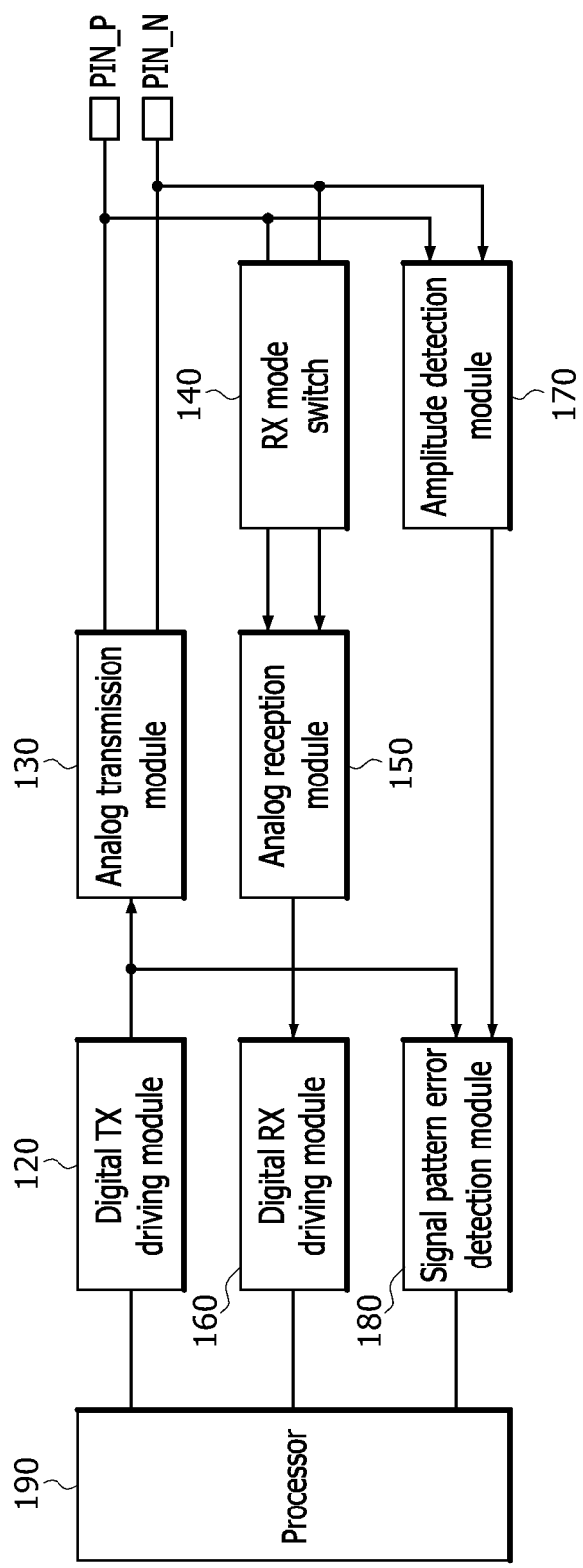
FIG. 2 is an exemplary diagram illustrating a schematic construction of an apparatus for avoiding a collision between data according to an embodiment of the present disclosure.
Figure 3:
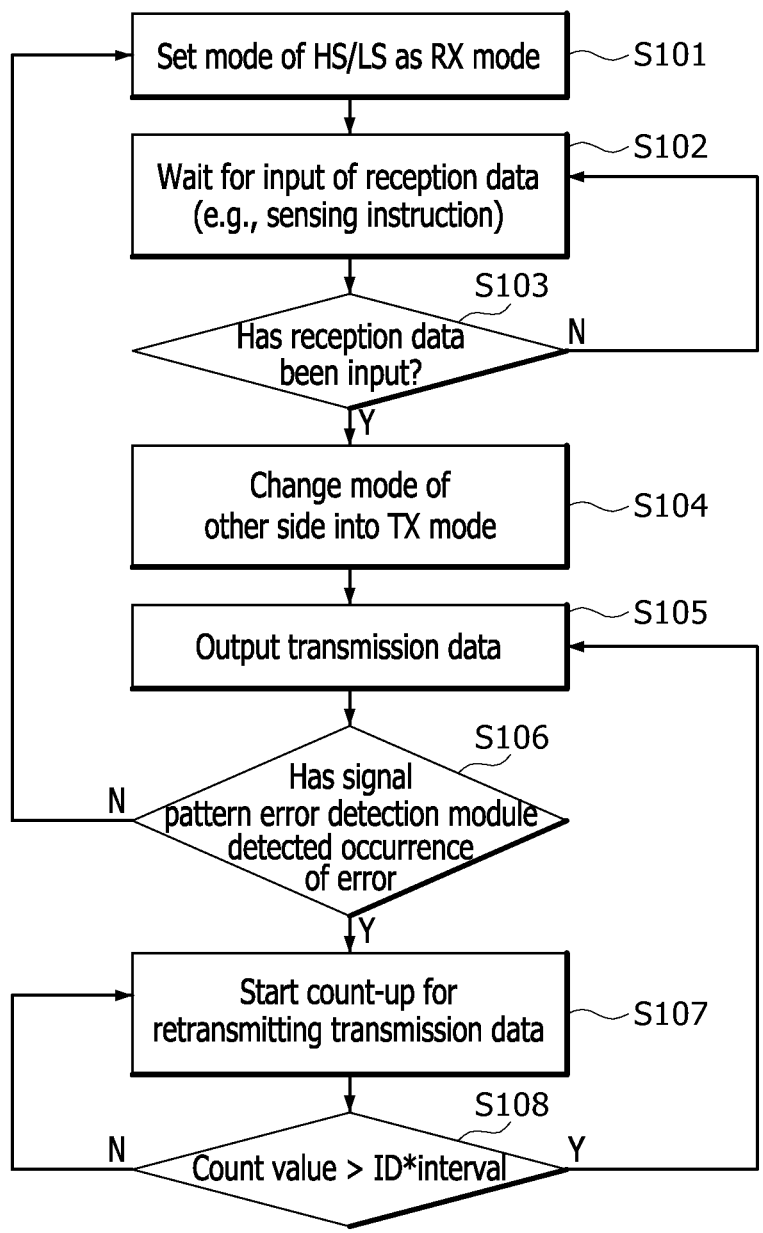
FIG. 3 is a flowchart for describing a method of avoiding a collision between data according to an embodiment of the present disclosure.
Figure 4A:
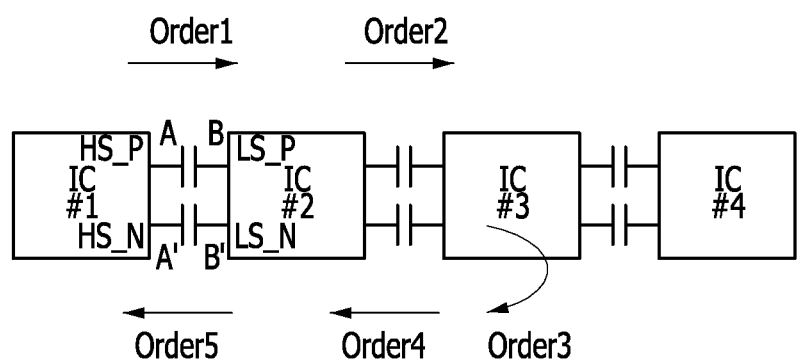
FIGS. 4A and 4B are exemplary diagrams illustrating a waveform of transmission data that is transmitted by an IC before the transmission data passes through an insulating element and a waveform of reception data that is received by an IC after the transmission data passes through the insulating element in FIG. 1.
Figure 4B:
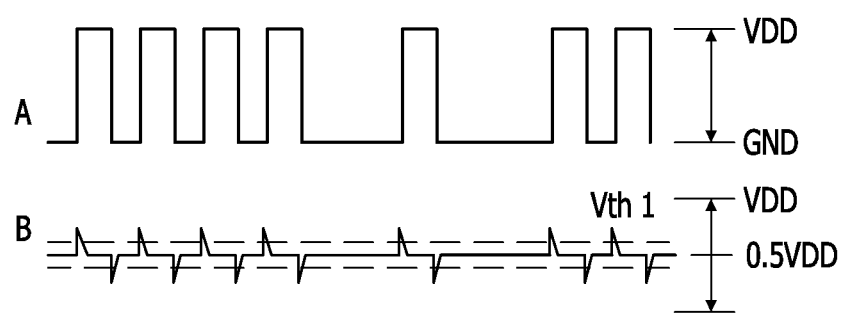
Figure 5A:
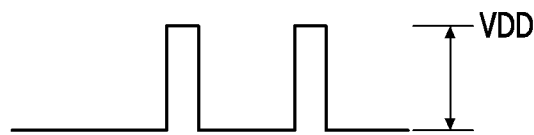
FIGS. 5A to 5C are exemplary diagrams illustrating amplitudes of waveforms that are detected by an amplitude detection module in a situation in which transmission and reception data collide against each other through two pins PIN_P and PIN_N of an IC in a TX mode of the IC in FIG. 2.
Figure 5B:
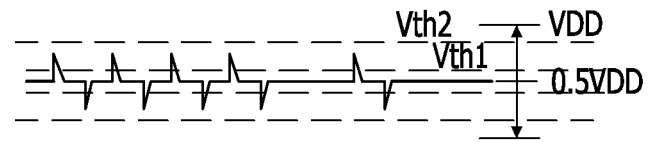
Figure 5C:
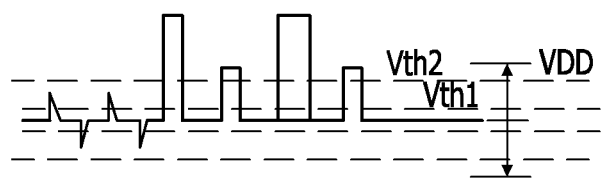

FIG. 2 is an exemplary diagram illustrating a schematic construction of an apparatus for avoiding a collision between data according to an embodiment of the present disclosure. FIG. 3 is a flowchart for describing a method of avoiding a collision between data according to an embodiment of the present disclosure. FIGS. 4A and 4B are exemplary diagrams illustrating a waveform of transmission data that is transmitted by an IC before the transmission data passes through an insulating element and a waveform of reception data that is received by an IC after the transmission data passes through the insulating element in FIG. 1. FIGS. 5A to 5C are exemplary diagrams illustrating amplitudes of waveforms that are detected by an amplitude detection module in a situation in which transmission and reception data collide against each other through two pins PIN_P and PIN_N of an IC in a TX mode of the IC in FIG. 2.

As illustrated in FIG. 2, the apparatus for avoiding a collision between data according to the present embodiment includes a digital TX driving module 120, an analog transmission module 130, an RX mode switch 140, an analog reception module 150, a digital RX driving module 160, an amplitude detection module 170, a signal pattern error detection module 180, and a processor 190.

The processor 190 processes the transmission and reception of data through a high side (HS) (i.e., a direction for communication with an IC on one side according to a signal flow) and a low side (LS) (i.e., a direction for communication with an IC on the other side according to a signal flow).

The digital TX driving module 120 receives transmission data (or TX data) generated by the processor 190 in the TX mode of an IC, and outputs the transmission data in a digital pulse form (i.e., a VDD full-swing pulse) (refer to a signal A in FIG. 4B).

The analog transmission module 130 outputs transmission data (or TX data) having a digital pulse form, which is output by the digital TX driving module 120 in the TX mode, in an analog way through two pins PIN_P and PIN_N of an IC.

The RX mode switch 140 switches from the TX mode into an RX mode under the control of the processor 190.

In the RX mode, the analog reception module 150 receives reception data (or RX data) that is input through the two pins PIN_P and PIN_N in an analog way.

The digital RX driving module 160 converts reception data (or RX data), which is received from the analog reception module 150 in the RX mode, into data having a digital pulse form, and transfers the data having a digital pulse form to the processor 190.

The amplitude detection module 170 detects (or measures) amplitudes of transmission data (or TX data) and/or reception data (or RX data) that are input and output through the two pins PIN_P and PIN_N.

For example, the amplitude of the transmission data (or TX data) that is output by the digital TX driving module 120 is illustrated in FIG. 5A. The amplitude of normal transmission data (or TX data) that is output through the two pins PIN_P and PIN_N is equal to or greater than a second threshold Vth2 as in FIG. 5C. The amplitude of normal reception data (or RX data) that is input through the two pins PIN_P and PIN_N is between a first threshold Vth1 and the second threshold Vth2 as in FIG. 5B.

The signal pattern error detection module 180 detects a situation in which reception data (or RX data) is input through the two pins PIN_P and PIN_N simultaneously when transmission data (or TX data) is output through the two pins PIN_P and PIN_N in the TX mode (i.e., a situation in which the transmission data and the reception data collide against each other).

For example, as described above, in a situation in which transmission data and reception data collide against each other through the two pins PIN_P and PIN_N in the TX mode, the amplitude detection module 170 detects an amplitude greater than the second threshold Vth2, when a pulse of transmission data (or TX data) and a pulse of reception data (or RX data) overlap as in FIG. 5C. That is, when a collision between the transmission data and the reception data occurs in the TX mode, a waveform different from a waveform of the transmission data that is generated by the processor 190 is detected due to an irregular pattern that is generated because energy charging of the transmission data and the reception data occurs in the two pins PIN_P and PIN_N.

Accordingly, the signal pattern error detection module 180 determines whether the transmission data and the reception data collide against each other through the two pins PIN_P and PIN_N in the TX mode by comparing the amplitude of the transmission data (or TX data) that is output by the digital TX driving module 120 and the amplitude of the transmission data, which is output by the amplitude detection module 170, and outputs an error detection signal (i.e., a signal that notifies the detection of the situation in which the transmission data and the reception data collide against each other through the two pins PIN_P and PIN_N in the TX mode) to the processor 190.

Accordingly, the processor 190 enables the transmission data (or TX data) to be transmitted normally and also the reception data (or RX data) to be received normally by enabling the transmission data (or TX data) to be retransmitted while avoiding the collision between the transmission data and the reception data according to a designated algorithm illustrated in FIG. 3.

As described above, the present disclosure can prevent a signal from being skipped or reduce the time that is taken for a signal to be received again compared to the existing technology, upon collision between transmission data and reception data.

This is more specifically described with reference to FIG. 3.

Referring to FIG. 3, the processor 190 sets the mode of the high side HS and the low side LS as the RX mode (S101), and waits for the input of reception data (e.g., a sensing instruction) from any one side (HS or LS) (S102).

When the reception data is input from any one side (HS or LS) (Y in S103), the processor 190 changes the mode of the other side (LS or HS) into the TX mode (S104), and outputs transmission data (S105).

For example, if there occurs a situation in which reception data (or RX data) is input through the two pins PIN_P and PIN_N simultaneously when transmission data (or TX data) is output through the two pins PIN_P and PIN_N in the TX mode (i.e., if a situation in which the transmission data and the reception data collide against each other occurs), the signal pattern error detection module 180 may detect the occurrence of an error (i.e., a situation in which the transmission data and the reception data collide against each other through the two pins PIN_P and PIN_N in the TX mode) as described above.

That is, in case of the situation in which the transmission data and the reception data collide against each other through the two pins PIN_P and PIN_N in the TX mode, the amplitude detection module 170 may detect an amplitude greater than the second threshold Vth2 when a pulse of the transmission data (or TX data) and a pulse of the reception data (or RX data) overlap as in FIG. 5C, and may detect a waveform different from a waveform of the transmission data generated by the processor 190. Accordingly, the signal pattern error detection module 180 may detect the occurrence of an error (i.e., the situation in which the transmission data and the reception data collide against each other through the two pins PIN_P and PIN_N in the TX mode).

Accordingly, when the signal pattern error detection module 180 detects the occurrence of the error (i.e., the situation in which the transmission data and the reception data collide against each other through the two pins PIN_P and PIN_N in the TX mode) (Y in S106), the processor 190 starts count-up for retransmitting the transmission data (or TX data) (S107).

In this case, a count value may be set by multiplying each of the IDs (e.g., IC #1, IC #2 to IC #N) of the ICs by a designated interval value.

Accordingly, the processor 190 starts the count-up for retransmitting the transmission data (or TX data), returns to step S105 when a count value is greater than a preset count value (i.e., ID*interval) (Y in S108), and outputs (i.e., retransmits) the transmission data (or TX data).

In this case, a collision between the transmission data and the reception data does not occur again because the count value (i.e., ID* interval) also becomes different due to the ID different for each IC.

As described above, the present disclosure has an effect in that transmission data and reception data can be transferred normally because a collision between the transmission data and the reception data can be detected and avoided upon insulation communication between ICs.

Although exemplary embodiments of the disclosure have been disclosed for illustrative purposes, those skilled in the art will appreciate that various modifications, additions and substitutions are possible, without departing from the scope and spirit of the disclosure as defined in the accompanying claims. Thus, the true technical scope of the disclosure should be defined by the following claims.

What is claimed is:

1. An apparatus for avoiding a collision between data, comprising:
    a processor;
    a plurality of integrated circuits (ICs) configured to mutually perform insulation communication, the plurality of integrated circuits including a first integrated circuit;
    an amplitude detection module configured to detect amplitudes of transmission data and reception data that are input and output through pins of the first integrated circuit during the insulation communication between the plurality of integrated circuits; and
    a signal pattern error detection module configured to determine a collision situation between the transmission data and the reception data by comparing a first amplitude of transmission data, which is generated by the processor in a transmission mode of the first integrated circuits, and a second amplitude of the transmission data, which is detected through the pins of the first integrated circuits by the amplitude detection module,
    wherein the processor performs an avoidance operation when determining a collision situation between the transmission data and the reception data.

2. The apparatus of claim 1, wherein the signal pattern error detection module detects a situation in which the reception data is input through the pins of the first integrated circuit simultaneously when the transmission data is output through the pins in the transmission mode of the first integrated circuit, as a situation in which the transmission data and the reception data collide against each other.

3. The apparatus of claim 1, wherein the amplitude detection module detects a waveform of a pattern comprising a waveform different from a waveform of the transmission data generated by the processor due to energy charging of the transmission data and the reception data in the pins, when there occurs a situation in which the transmission data and the reception data collide against each other through the pins in the transmission mode of the first integrated circuit.

4. The apparatus of claim 3, wherein the amplitude detection module detects a waveform having an amplitude greater than a second threshold Vth2 that has been set to determine an amplitude of normal transmission data, when a pulse of the transmission data and a pulse of the reception data overlap in the situation in which the transmission data and the reception data collide against each other through the pins in the transmission mode of the first integrated circuit.

5. The apparatus of claim 1, wherein when there occurs a situation in which the transmission data and the reception data collide against each other through the pins in the transmission mode of the first integrated circuit, the processor starts count-up and then retransmits the transmission data when a count value reaches a preset count value.

6. The apparatus of claim 5, wherein the count value is set by multiplying an ID that is differently set for each of the integrated circuits by a pre-designated interval value.

7. A method of avoiding a collision between data, comprising:
    detecting, by an amplitude detection module, amplitudes of transmission data and reception data that are input and output through pins of a first integrated circuit (IC) among a plurality of integrated circuits during insulation communication between the plurality of integrated circuits mutually performing insulation communication;
    comparing, by a signal pattern error detection module, a first amplitude of transmission data, which is generated by a processor in a transmission mode of the first integrated circuit, and a second amplitude of the transmission data, which is detected through the pins of the first integrated circuit by the amplitude detection module; and
    performing, by the processor, an avoidance operation in response to a collision situation between the transmission data and the reception data.

8. The method of claim 7, further comprising determining, by the signal pattern error detection module, the collision situation between the transmission data and the reception data, the determination including detecting, by the signal pattern error detection module, a situation in which the reception data is input through the pins of the first integrated circuit simultaneously while the transmission data is output through the pins in the transmission mode of the first integrated circuit as a situation in which the transmission data and the reception data collide against each other.

9. The method of claim 7, wherein in order to detect a situation in which the transmission data and the reception data collide against each other through the pins in the transmission mode of the first integrated circuit, the method further comprises detecting, by the amplitude detection module, a waveform of a pattern comprising a waveform different from a waveform of the transmission data generated by the processor due to energy charging of the transmission data and the reception data in the pins of the first integrated circuit.

10. The method of claim 7, wherein there occurs a situation in which the transmission data and the reception data collide against each other through the pins in the transmission mode of the first integrated circuit, the method includes starting, by the processor, count-up and then retransmitting, by the processor, the transmission data in response to a count value reaching a preset count value.

\* \* \* \* \*